United States Patent [19]

Torre et al.

[11] 4,040,040
[45] Aug. 2, 1977

[54] CHANNEL BAR BUBBLE PROPAGATE CIRCUIT

[75] Inventors: Edward Della Torre, Toronto; Witold Kinsner, Hamilton, both of Canada

[73] Assignee: Canadian Patents and Development Limited, Ottawa, Canada

[21] Appl. No.: 671,069

[22] Filed: Mar. 29, 1976

[51] Int. Cl.² .................... G11C 11/14; G11C 19/00
[52] U.S. Cl. .................. 340/174 TF; 340/174 VA
[58] Field of Search ............ 340/174 TF, 174 VA, 340/174 PM, 174 SR, 174 NA

[56] References Cited
U.S. PATENT DOCUMENTS

| 3,503,054 | 3/1970 | Bobeck et al. | 340/174 TF |
|---|---|---|---|
| 3,644,908 | 2/1972 | Bobeck | 340/174 TF |
| 3,678,479 | 7/1972 | Owens | 340/174 TF |
| 3,693,177 | 9/1972 | Owens | 340/174 TF |

*Primary Examiner*—Vincent P. Canney
*Attorney, Agent, or Firm*—Edward Rymek

[57] ABSTRACT

The magnetic bubble propagate circuit combines the forces on a bubble due to the properties of a modulated channel in a bubble material with the forces on the bubble due to a field produced by discrete magnetic poles $P_1$ and $P_2$ to move the bubble along a predetermined path. The channels may be modulated in width or in depth and be of the mesa or groove type so as to have a channel with periodically spaced stable bubbles positions O which are separated by barrier positions X. The poles $P_1$ and $P_2$ consist of soft-magnetic material bars which are placed either along the channel perpendicular thereto such that alternate ends of sequential bars overlap the channel between pairs of stable positions, each bar providing a pole $P_1$ or $P_2$, or along the channel parallel thereto such that the ends of the bars fall between adjacent pairs of stable positions, each bar providing a pole $P_1$ and $P_2$. The propagate circuit thus has repeated pattern O, X, $P_1$, O, X, $P_2$. The bars $P_1$ and $P_2$ are periodically magnetized to opposite polarities by an alternating transverse magnetic field which is parallel to the length of the bars to produce a force on the bubbles which are in a stable positions to move them across adjacent barrier positions X. When the field reverses, the bubbles move across the next barrier. Turn-around circuits and as transfer gates which may be combined with the basic propagate circuit to form loop and minor-major loop memory arrangements may be similarly constructed. These are made such that the pattern O, X, $P_1$, O, X, $P_2$ is not broken either between two parallel propagate circuits to form a loop or between a minor loop and a major loop in a memory arrangement. The minor loop and the major loops are driven by independent perpendicular alternating magnetic fields and thus these fields control the transfer of bubbles between them.

13 Claims, 32 Drawing Figures

CHANNEL BAR BUBBLE PROPAGATE CIRCUIT

This invention relates to magnetic bubble domain memories and in particular to novel magnetic bubbledomain propagate circuits as well as compatible turn-around circuits and transfer gates for use in bubble memories.

Bubble propagation can presently be achieved by anyone of four basic methods. The propagating force is induced by either: (a) alternating bias field, (b) electric current, (c) alternating transverse field, or (d) rotating transverse field.

A circuit associated with the alternating bias field method has a wedge-shaped pattern called Angel-fish. The pattern consists of soft magnetic materials, such as permalloy, or it can be etched into the bubble material in the form of depressions or mesas. The indented circuit propagates in the same direction as the permalloy overlay whereas the mesa circuit propagates in the reverse direction as in the case of the negative permalloy pattern. Disadvantages of the circuit are: narrow operating margins, low speed (15 kHz), and difficulty in performing the auxiliary functions such as detection or transfer between loops.

There are several circuits associated with the electric current method: shaped conductor loops, permalloy dots-conductors or permalloy dot-channel-serpentine conductors. The circuits do not require a transverse field and are fast (5 MHz). Multiconductor circuits have essentially the same operating margins for turns as for straight line tracks. Single conductor-channel circuits require very gradual turns. The channel can be constructed as permalloy, negative permalloy, groove or mesa, ion-implanted serrated channel, or annealedsilicon ratchet channel. Difficulty arises in passing the electric current through the conductor due to discontinuities and heating.

There exist two basic circuits which propagate using an alternating transverse field: the hard-soft bar circuit described in U.S. Pat. No. 3,541,535 to A. J. Perneski, and the parallel bar circuit described in U.S. Pat. Nos. 3,705,394 to E. Della Torre and 3,927,398 to E. Della Torre and W. Kinsner. These circuits are insensitive to transverse fields parallel to the direction of propagation. This feature dramatically simplifies transfer gates and other functional circuits; it also reduces the driving power requirement by 50%.

The rotating transverse field method of propagation uses an in-plane rotating field which acts on a permalloy pattern to produce an effective travelling wave in the bubble material. There are the following distinct groups of patterns: T-bar, Y-bar, X-bar, chevron and disk-train. The last circuit is formed by ion implantation and the others are made of permalloy. The chevron circuit differs from all others in that successive chevron elements can be very closely spaced. Such a multichevron circuit can propagate strip domains over a wide range of the bias field. It is difficult to construct functional circuits using the above patterns.

The main advantage of the field-access devices, bias and transverse field, is that they principally avoid the need for electrical contact to the bubble chip. However, the commonly used rotating transverse field bubble circuits do utilize electrical connections to the chip in order to perform the necessary functions such as bubble generation or controlled bubble transfer. Without the auxiliary electric currents the functional circuits become very complicated. It is, therefore, desirable to eliminate the electrical connections, preserving, at the same time, the best features of both the electric current circuits and the field-access circuits.

It is therefore an object of this invention to provide a bubble propagate circuit having high speed and wide operating margins.

It is a further object of this invention to provide a bubble propagate circuit which with its functional circuits is simple in construction.

It is another object of this invention to provide a bubble propagate circuit which only requires an alternating transverse magnetic field to propagate bubbles within a loop.

It is a further object of this invention to provide bubble propagate circuits capable of independent bubble propagation in two circuits having identical parallel bubble paths.

These and other objects are achieved in a magnetic bubble propagate circuit in which forces on a bubble due to the properties of a modulated channel in a bubble material are combined with forces on the bubble due to a field produced by discrete magnetic poles $P_1$ and $P_2$ to move the bubble along a predetermined path. The channels may be modulated in width or in depth and be of the mesa or groove type so as to have a channel with periodically spaced stable bubbles positions O which are separated by barrier positions X. The poles $P_1$ and $P_2$ consist of soft-magnetic materials bars which are placed either along the channel perpendicular thereto such that alternate ends of sequential bars overlap the channel between pairs of stable positions, each bar providing a pole $P_1$ or $P_2$, or along the channel parallel thereto such that the ends of the bars fall between adjacent pairs of stable positions, each bar providing a pole $P_1$ and $P_2$. The propagate circuit thus has a repeated pattern O, X, $P_1$, O, X, $P_2$. The bars $P_1$ and $P_2$ are periodically magnetized to opposite polarities by an alternating transverse magnetic field which is parallel to the length of the bars to produce a force on the bubbles which are in stable positions to move them across adjacent barrier positions X. When the field reverses, the bubble move across the next barrier. Turn-around circuits and transfer gates which may be combined with the basic propagate circuit to form loops and minormajor loop memory arrangement may be similarly constructed. These are made such that the pattern O, X, $P_1$, O, X, $P_2$ is not broken either between two parallel propagate circuits to form a loop or between a minor loop and a major loop in a memory arrangement.

The minor loops and the major loops are driven by independent perpendicular magnetic fields and thus these fields also control the transfer of bubbles between them.

Figure 1:
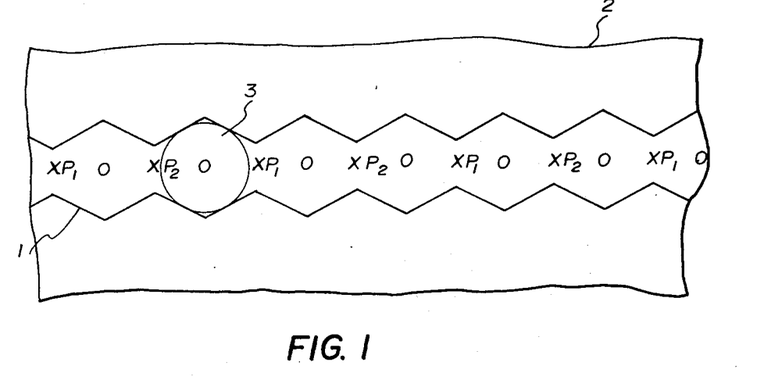
FIGS. 1 to 5 schematically illustrate the principle of the bubble propagate circuit in accordance with this invention.

The basis upon which magnetic bubble propagation is achieved in a bubble supporting material is illustrated schematically in FIG. 1. The bubble propagation circuit in accordance with this invention includes a channel 1 formed in the bubble supporting material 2 such that the channel 1 has periodically spaced energy traps O where a bubble is stable, these traps being separated by barriers X where a bubble is not stable. The channel 1 can be created by etching either a groove or a mesa, by ion implantation, by diffusion of certain atoms such as silicon or by deposition of either a positive or a negative permalloy pattern. The traps can be formed by varying the width of the channel 1, the depth or both. The effect of the channel 1 can be described by an electric current flowing along the perimeter of the channel equal in magnitude to the product of the depth of the channel and the difference in magnetization between the channel and the surrounding medium. Both channels of higher and lower magnetization than the surrounding medium are stable. Channels of lower magnetization, such as groove channels, have stable bubble positions on both sides of the channel and therefore are very stable when the channel width is in the order of one bubble diameter, however, when the width is greater or equal to three bubble diameters, the stable positions on the two sides are so widely separated that a bubble on one side will not be affected by the stable positions on the other side, as will be described further below. On the other hand, channels of higher magnetization, such as mesa channels, have stable bubble positions along the center of channel irrespective of the channel width.

Figure 2:
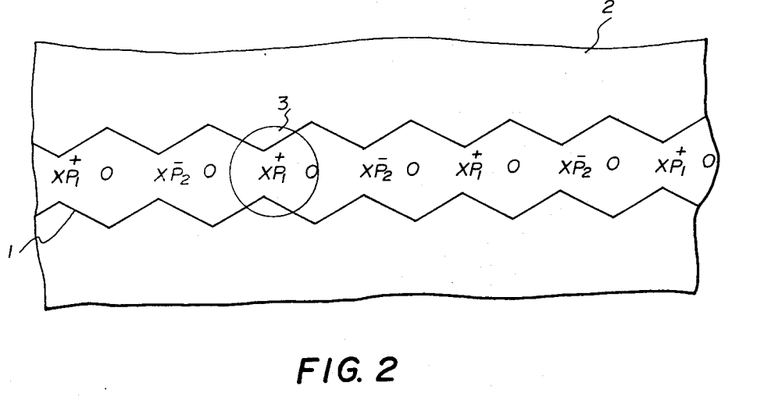
Figure 3:
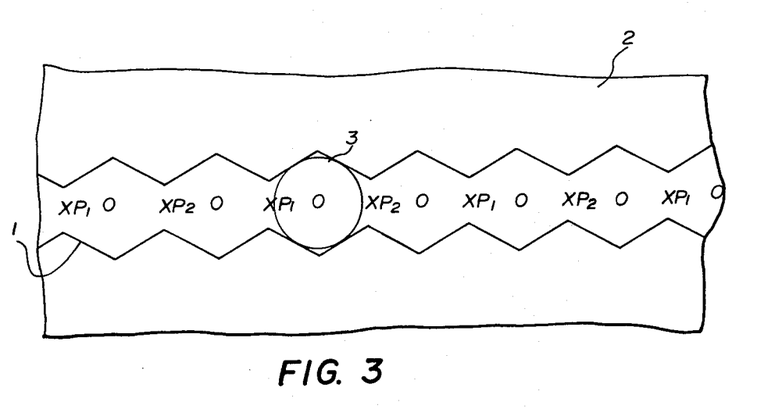
Figure 4:
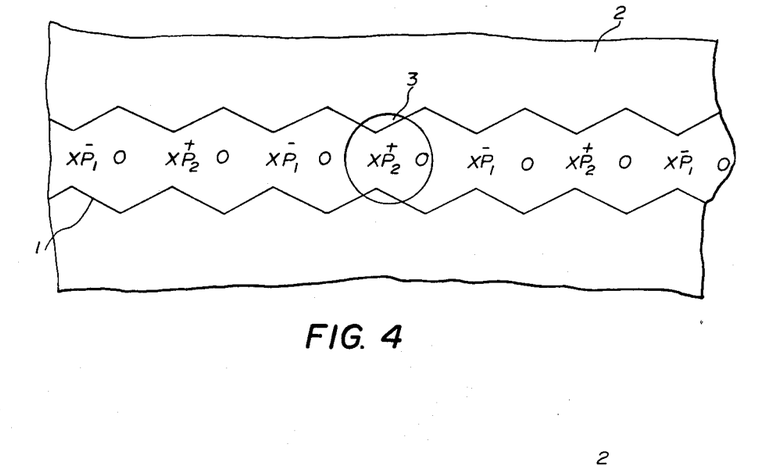
Figure 5:
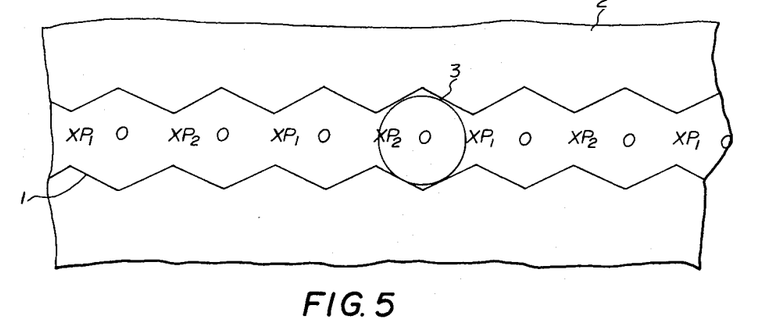

The bubble propagate circuit further includes well defined magnetic poles $P_1$ and $P_2$ which, when magnetized, are of opposite polarity. Poles $P_1$ and $P_2$ are positioned sequentially between the stable positions O and the unstable positions X in the channel 1. These poles are further made to periodically reverse their polarity through neutral by the application of an alternating transverse field to propagate a magnetic bubble along the channel 1 in the following manner. When poles $P_1$ and $P_2$ are neutral, the magnetic bubble 3 will be located in a stable position O as shown in FIG. 1. As poles $P_1$ and $P_2$ will produce a repelling force on bubble 3 and pole $P_1$ will produce an attracting force on bubble 3. The forces will overcome the barrier X forces and the bubble will thus be moved to a position under pole $P_1$ as shown in FIG. 2. As poles $P_1$ and $P_2$ are demagnetized, the bubble 3 will move to the closest stable position O as shown in FIG. 3. As poles $P_1$ and $P_2$ become magnetized in the opposite direction, i.e. $P_1$ and $P_2$ become negative and positive respectively, pole $P_1$ will attract bubble 3 and it will move to a position under pole $P_2$ as shown in FIG. 4. Finally, as poles $P_1$ and $P_2$ are demagnetized, the bubble 3 will move to the next closest stable position O as shown in FIG. 5 to complete one complete O, X, $P_1$, O, X, $P_2$, O channel propagate cycle.

For proper operation, the poles $P_1$ and $P_2$ must be located closer to the barrier or unstable positions X than to the stable positions O, though the exact distance is not critical. In addition, if poles $P_1$ and $P_2$ are positioned to the right of barrier positions X, as in FIGS. 1 to 5, the direction of propagation will be to the right, however, if poles $P_1$ and $P_2$ are positioned to the left of barrier positions X, the direction of propagation will be to the left.

Figure 6:
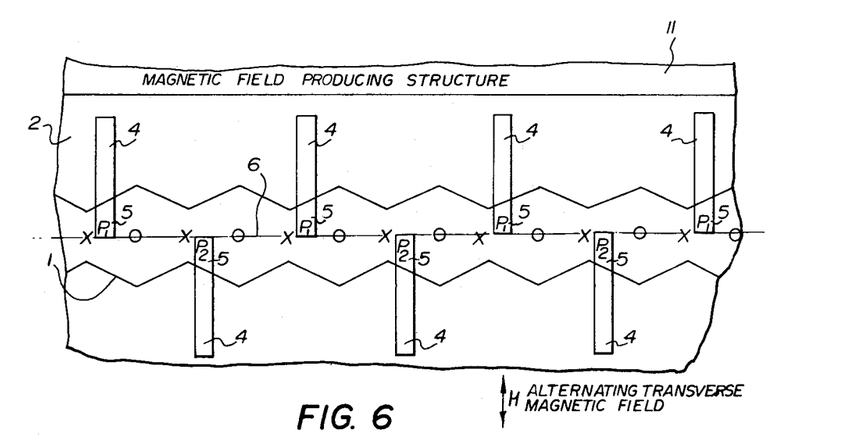
FIG. 6 illustrates a channel-bar circuit with the bars perpendicular to the channel.
Figure 7:
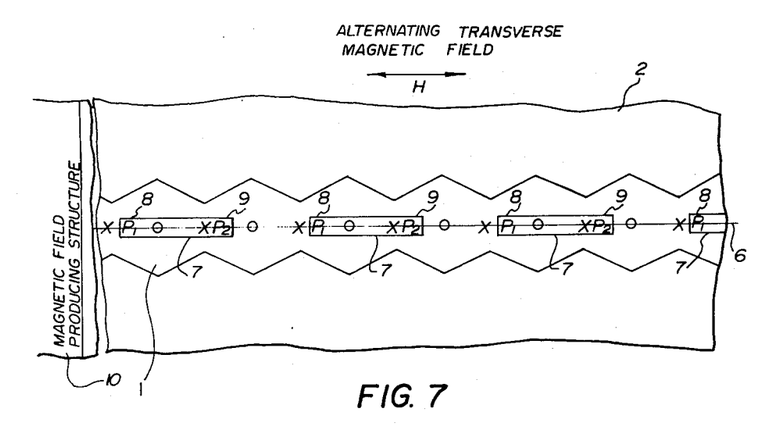
FIG. 7 illustrates a channel-bar circuit with the bars parallel to the channel.

The poles $P_1$ and $P_2$ are formed by bars of a magnetically soft material, such as permalloy, which are positioned over the channel 1. As shown in FIG. 6, bars 4 may be positioned perpendicular to channel 1 such that one end 5 of each bar 4 is used as a pole $P_1$ or $P_2$. The ends 5 of the bars 4 are shown terminated at the centerline 6 of channel 1, however to obtain a straight line propagation of a bubble, the ends 5 should overlap the channel centerline 6. Alternately, as shown in FIG. 7, bars 7 may be positioned over the channel 1 parallel to the channel centerline 6 such that one end 8 of the bars 7 form poles $P_1$ and the other end 9 of bars 7 form poles $P_2$. This arrangement provides straight line propagation and may be used with both narrow and wide channels 1. Further for straight line propagation in the arrangements shown in FIGS. 6 and 7 the narrowest and the widest width of the channel 1 would be approximately R and 2R respectively where R is the radius of a bubble in a given material 2. The channel 1 serration angles could be approximately 30°–45°. If the channels 1 are made of either the positive or the negative permalloy patterns then they would be approximately 200 to 500 Å thick and in the direct contact with the bubble supporting material 2, as contrasted from the propagate bars which are much thicker and separated from the channel-defining permalloy patterns. The circuit period may be as small as four bubble radii, 4R.

Figure 8:
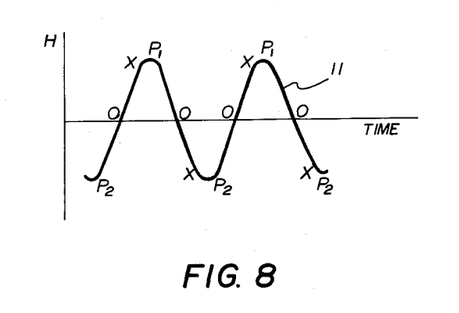
FIG. 8 illustrates the oscillating magnetic fields for the circuits in FIGS. 6 and 7.

In both of the arrangements shown in FIGS. 6 and 7, the bars 4 and 7 are similarly subjected to an alternating transvere magnetic field H which is produced by a magnetic field producing structure 10 such that it is parallel to the long axis of the bars so as to magnetize the bars. The oscillating magnetic H field 11 is illustrated in FIG. 8 and is marked to indicate the corresponding positions of the bubble 3 in the channel. The oscillating magnetic H field 11 may be made sinusoidal for simplicity, but need not be critically so. In fact, a sinusoidal oscillating field 11 will in general produce a non-uniform bubble velocity which may be made more uniform by appropriately shaping the waveform.

The aspect ratio iof the bars 4 or 7, i.e. the ratio of the long side to the short side may be approximately 5 to 10 and the width of the bars may be up to 2R. The thickness of the bars 4 or 7 may be approximately 0.6 to 2 μm, and the bars separated from the bubble material and the channel. Having a high aspect ratio, and consequently a low demagnetizing factor, the bars 4 or 7 need only have low fields to be magnetized sufficiently to achieve bubble propagation. The bars 4 or 7 are very insensitive to fields perpendicular to their long axis, giving greater independence of functions that must be performed in major-minor loop memory configurations.

The bar spacing may be a small as the size of the bubble to be propagated due to the well-defined energy traps and therefore high stability of the bubble.

Figure 9A:
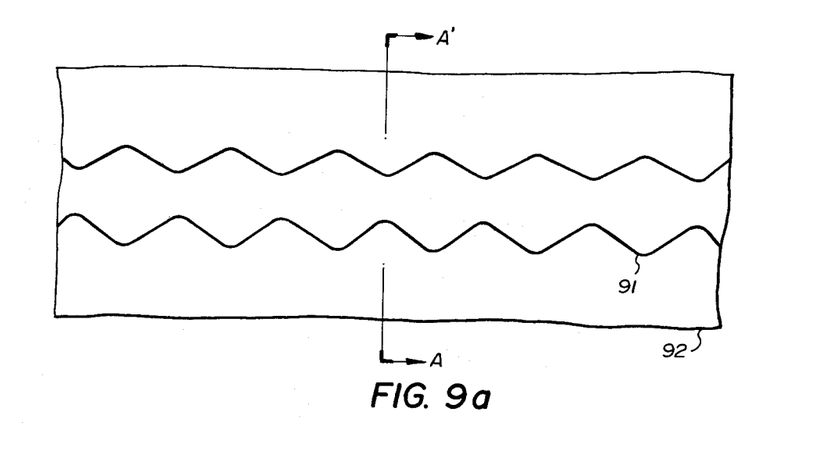
FIGS. 9a, 9b, and 9c illustrate a channel with curved sides.
Figure 9B:
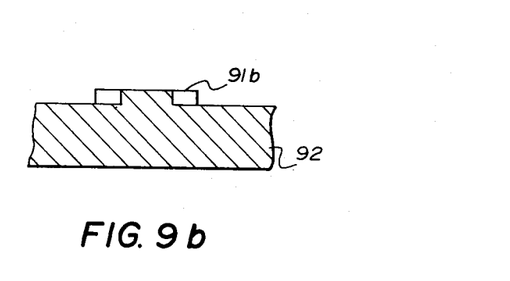
Figure 9C:
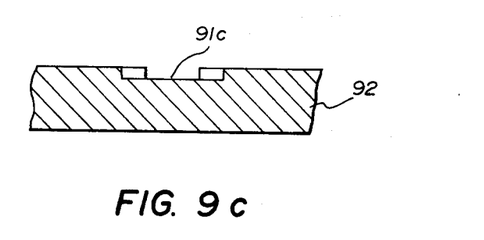

The shape of the channel may vary from the basic shape illustrated in FIGS. 1 to 8, to that as shown in FIGS. 9a to 11c. The channel 91 illustrated in FIG. 9a is basically the same as the channel in FIGS. 1 to 8 except that the channel 91 in the bubble material has curved sides rather than straight sides. The channel may be formed as a mesa channel 91b as shown in cross-section in FIG. 9b. The cross-sections are taken along plane A–A' in FIG. 9a.

Figure 10A:
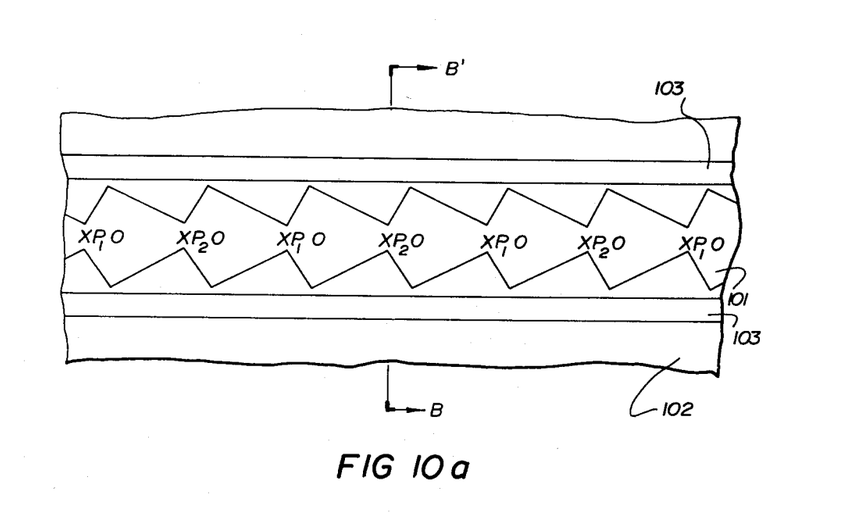
FIGS. 10a and 10b illustrate a channel with an angelfish pattern.
Figure 10B:
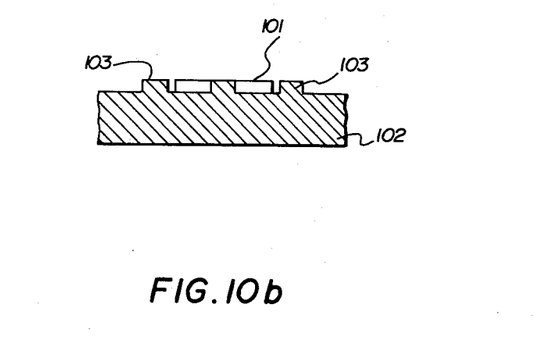

The channel 101 on the bubble material 102 illustrated in FIG. 10a and in cross-section in FIG. 10b, which is taken along plane B–B' in FIG. 10a, has the form of an Angel-fish pattern. The stable position O will not be centered between the barriers positions X due to the geometry of the channel 101 and therefore, the poles $P_1$ and $P_2$ will necessarily be closer to the barrier positions X than in channel 1 in FIG. 1. In addition, for stability, guiding rails 103 are formed on either side of the channel 101. A groove channel with a top view identical to that in FIG. 10a can also be constructed.

Figure 11A:
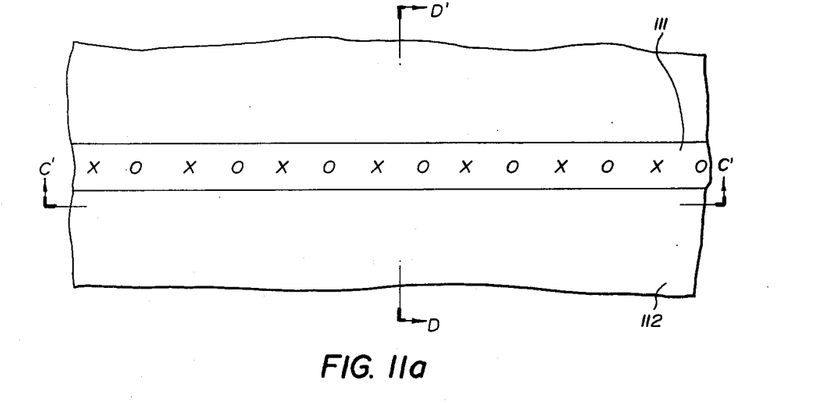
FIGS. 11a, 11b and 11c illustrate a channel modulated in depth.
Figure 11B:
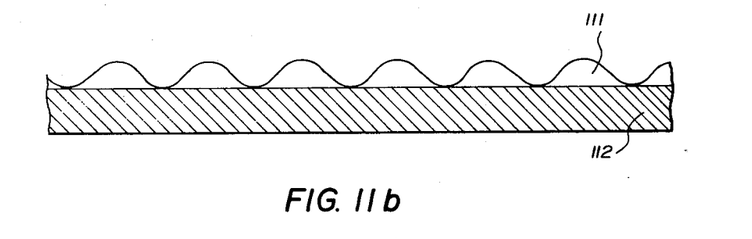
Figure 11C:
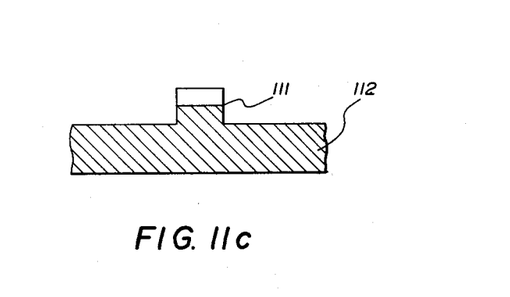

The channel 111 in the bubble material 112 illustrated in FIG. 11a as well as in FIGS. 11b and 11c which are cross-sections taken along planes C–C', and D–D' respectively in FIG. 11a, is depth modulated to provide the periodic stable O and barrier X positions. A groove channel with a top view identical to that in FIG. 11a can also be constructed.

Figure 12:
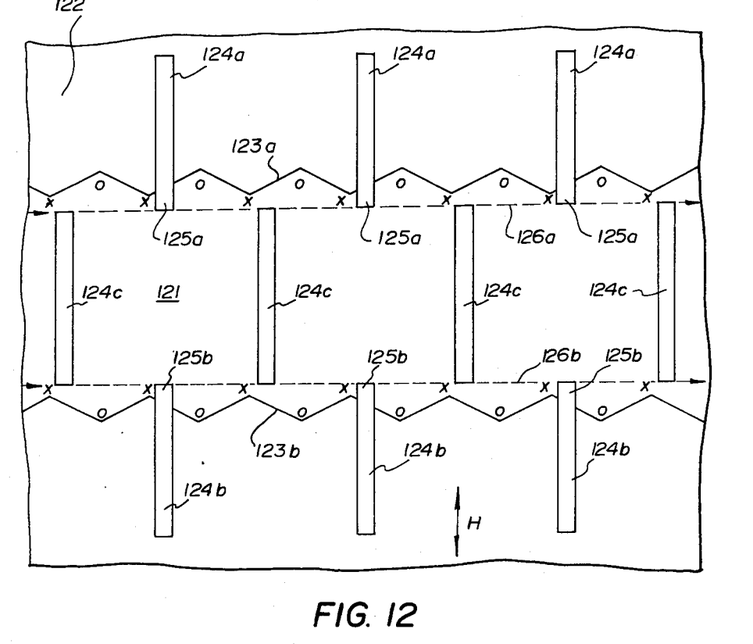
FIGS. 12 and 13 illustrate dual-path wide grooved channel propagate circuits.

Since in the groove-type channels, the stable positions for bubbles are on the sides of the groove, one channel may be adapted to propagating bubbles simultaneously along two parallel paths. One embodiment of the dual-path groove-channel propagate circuit is illustrated in FIG. 12. The channel 121 is formed in the bubble material 122 such that the narrowest and widest width of the channel 121 is approximately 5R and 6R respectively. This provides a first bubble path 126a along the one side 123a of the channel 121 and a second bubble path 126b along the other side 123b of the channel 121. The width of the channel 121 must be sufficient to prevent interaction between the bubbles in the two separate paths. Soft magnetic bars 124a, 124b and 124c, having their poles positioned near the barriers positions, are located over the channel 121, perpendicular to the channel 121. With the application of an oscillating transverse magnetic field H, bars 124a are positioned with one of their poles 125a on the bubble path 126a to move bubbles along that path, bars 124b are positioned with one of their poles 125b on the bubble path 126b to move bubbles along path 126a and the other on path 126b to move bubbles in both of the paths. This propagate circuit thus functions in a manner which is similar to the propagate circuit described with respect to FIG. 6 except that bubbles are simultaneously moved in the same direction along two parallel paths 126a and 126b.

Figure 13:
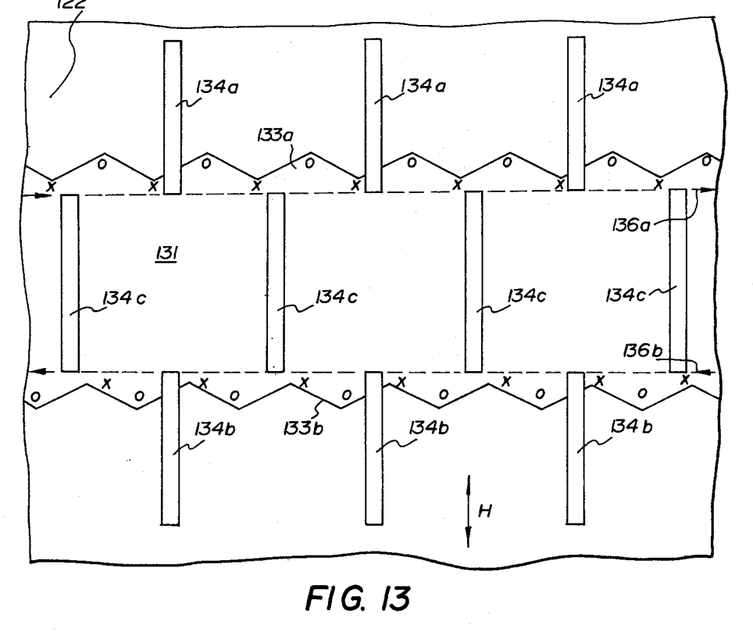

A second embodiment of the dual-path groove channel propagate circuit is illustrated in FIG. 13. This propagate circuit is similar to the one shown in FIG. 12 except that it has been adapted to propagate bubbles in the two paths in opposite directions. The channel 131 is formed in the bubble material 132 as in FIG. 12, except that the corrugation of side 133b is offset with respect to corrugation of side 133a. Thus, with a pattern of bars 134a 134 b and 134c, which is identical to the pattern in FIG. 12, located on the channel 131 and with the applicatin of an alternating transverse magnetic field H to the propagate circuit, the bubbles along path 136a will move to the right, while the bubbles along path 136b will move to the left.

As with the propagate circuit in FIG. 6, the soft-magnetic bars 124a, 124b and 124c in FIG. 12 and 134a, 134b and 134c in FIG. 13 may be replaced by bars which are parallel to the channel to form patterns as illustrated in FIG. 7. In FIG. 12, for example, a first set of bars would be positioned over bubble path 126a and a second set of bars would be placed over bubble path 126b. In this type of configuration, the alternating transverse magnetic field would be parallel to the bars and the channel 121. The direction of propagation would depend on whether the ends of the bars terminate to the right or the left of the barrier positions X.

Figure 14:
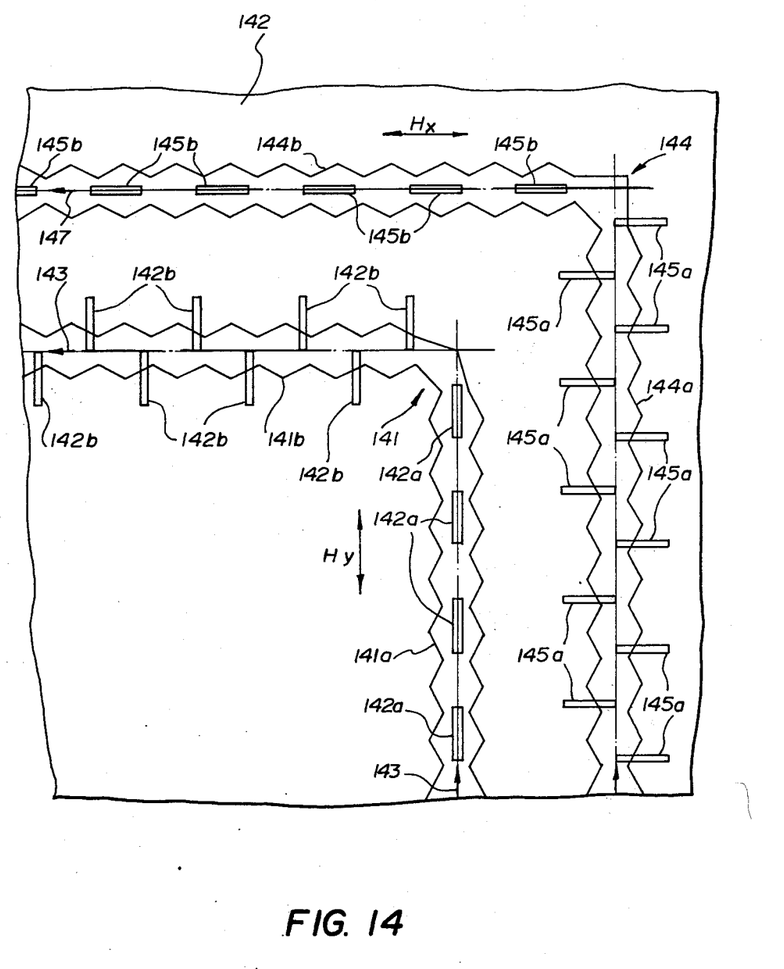
FIG. 14 illustrates two propagate circuits controlled by independent fields which are perpendicular to one another.

One advantage of the channel-bar propagate circuit in accordance with this invention is that the circuit with the same bars (perpendicular or longitudinal) can propagate bubbles in any single direction by an independent transverse field. If the circuit uses both the perpendicular and the longitudinal bars in mutually perpendicular channels then only one transverse field is required to propagate bubbles in the directions of the channels and yet preserves the independence of propagation in channels with bars perpendicular to the former ones. This is shown in FIG. 14 where a first channel 141 is formed on the bubble material 142 such that one section 141a of the channel 141 is perpendicular to a second section 141b of the channel 141. Magnetic propagating bars 142a are positioned parallel to the channel section 141a over the channel centerline, while magnetic propagating bars 142b are positioned perpendicular to the channel section 141b are positioned perpendicular to the channel section 141b with one end bar over the channel centerline. An alternating transverse magnetic field Hy which oscillates in a direction parallel to the major axis of bars 141a and 141b causes bubbles to propagate along sections 141a and 141b of channel 141, as shown by arrow 143. A second channel 144 identical to channel 141 is formed on the bubble material 142 such that one section 144a of the channel 144 is perpendicular to a second section 144b. Thus channel section 144a is parallel to channel section 141a and channel sectin 144b is parallel to channel section 141b. Magnetic propagate bars 145a are positioned perpendicular to channel section 144a with one end of each bar over the channel centerline, while magnetic propagate bars 145b are positioned parallel to channel section 144b over the channel centerline. Thus bars 141a and 141b are perpendicular to bars 145a and 145b. An alternating transverse magnetic field Hx which oscillates in a directin parallel to the major axis of bars 145a and 145b causes bubbles to propagate along sections 144a and 144b, as shown by arrows 146. Thus two propagate circuits with identical bubble paths can propagate bubbles completely independently.

Figure 15:
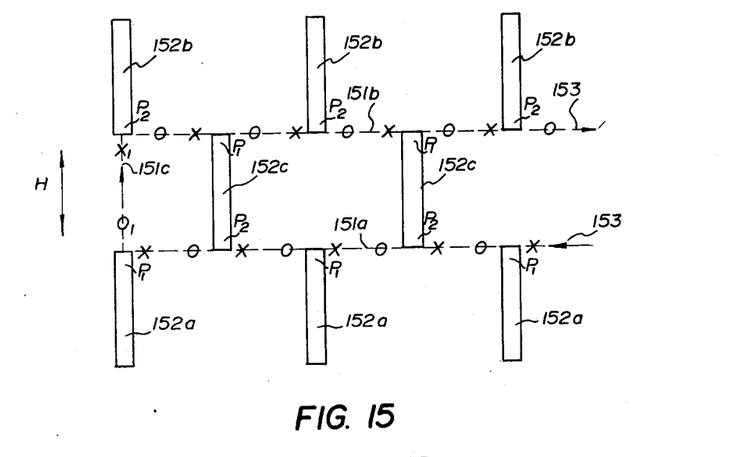
FIGS. 15, 16 and 17 illustrate turn-around circuits for parallel path loops.
Figure 16:
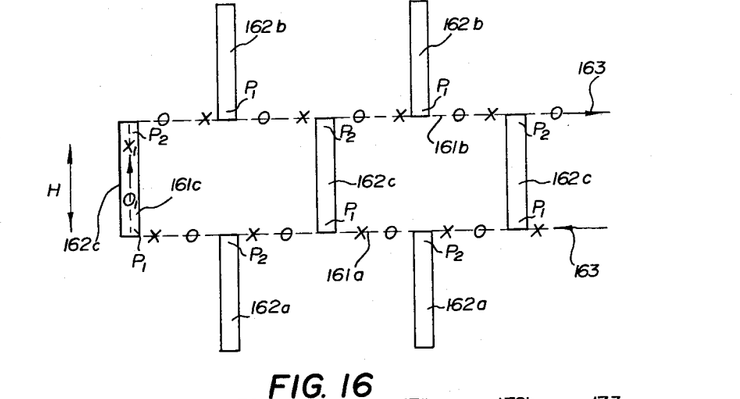
Figure 17:
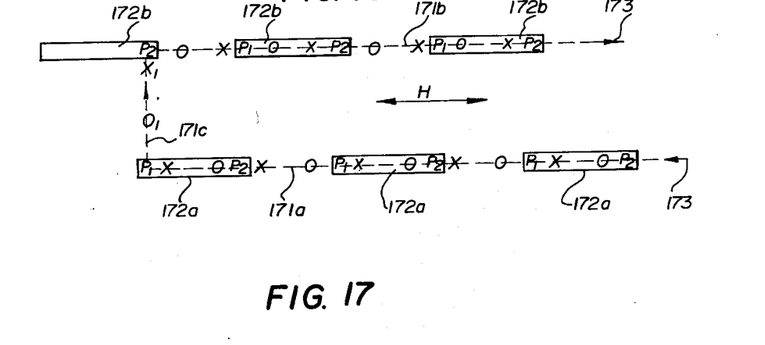

To utilize the channel-bar propagate circuit in major-minor loop memory organizations, turn-around circuits are required. FIGS. 15 to 17 schematically illustrate three possible turn-around circuits for narrow channel propagate circuits. In order to simplify these FIGS. only the bars with poles $P_1$ and $P_2$, the stable positions O and the barrier positions X are indicated.

In FIG. 15, two channel-bar propagate circuits are located in parallel. The include two parallel channels having bubble paths 151a and 151b respectively and bars 152a, 152b and 152c which are positioned over paths 151a and 151b such that the ends of paths 151a and 151b are overlaid by a bar 152a and 152b respectively.

An alternating transverse magnetic field H propagates bubbles in these circuits in the direction shown by arrows 153. In order to allow a bubble to move from path 151a to path 151b, a channel section having a path 151c is located so as to connect the ends of the channels having paths 151a and 151b. This connecting channel section include a stable position $O_1$ near path 151a and a barrier position $X_1$ near path 151b.

In the circuit shown in FIG. 16, channels having paths 161a, 161b and 161c are identical to the channels having paths 151a, 151b, and 151c in FIG. 15. A pattern of bars 162a, 162b, and 162c are positioned over paths 161a, and 161b such that the ends of paths 161a and 161b, and thus path 161c, are overlaid by a single bar 162c. The field H drives bubbles around this circuit as indicated by arrows 163. The turn-around circuit illustrated in FIGS. 15 and 16 are for use with the channel-bar propagate circuit in FIG. 6.

A turn-around circuit for the channel-bar propagate circuit in FIG. 7, is shown in FIG. 17. Once again, this circuit includes channels having paths 171a 171b and 171c which are identical to the channels having paths 151a, 151b and 151c in FIG. 15. A first set of bars 172a are positioned over path 171a such that the end of path 171a is overlaid by a complete bar 172a. A second set of bars 172b are positioned over path 171b such that the end of path 171b is overlaid by only one pole of a bar 172b. The field H drives bubbles around this circuit as shown by arrows 173.

Figure 18:
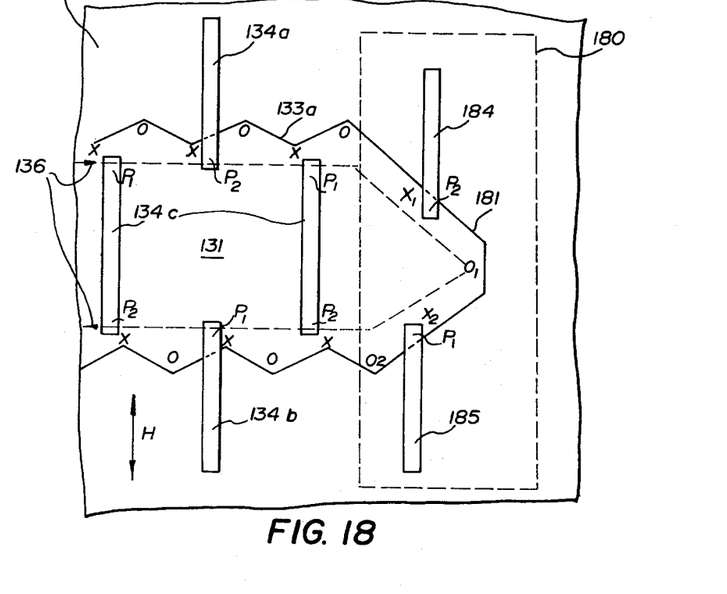
FIG. 18 illustrates a turn-around circuit for a dual-path propagate circuit.

A turn-around circuit for a wide channel propagate circuit illustrates in FIG. 13 is shown in FIG. 18. The wide channel propagate circuit includes a sequence of stable O and barrier X positions on each side of the channel 131 formed in the bubble material 122, and the channel 131 is overlaid by a pattern of soft magnetic bars 134a, 134b and 134c. For the turn-around circuit 180, the channel 131 is terminated by an end section 181 which has an even number of barrier and stable positions, such as $X_1$, $O_1$, $X_2$ and $O_2$ in sequence. A first magnetic bar 184 is located so as to have one pole $P_2$ over the end section 181 between the barrier position $X_1$ and the stable position $O_1$, and a second magnetic bar 185 is located so as to have one pole $P_1$ over the end section 181 between the barrier position $X_2$ and the stable position $O_2$. The bars 184 and 185 are parallel to all of the other circuit propagate bars 134a, 134b, and 134c.

This turn-around circuit as well as those illustrated in FIGS. 15 to 17 function in the same manner and are analogous to straight line propagation since the sequence of stable positions, barrier positions and discrete poles are identical. For straight line propagation the sequence is O, X, $P_1$, O, X, $P_2$, O, X, $P_1$, O, X, $P_2$, O, . . . ; for the circuits in FIGS. 15 to 17, the sequence is O, X, $P_1$, O, X, $P_2$, O, X, $P_1$, $O_1$, $X_1$, $P_2$, O, . . . ; and for the circuit in FIG. 18, the sequence is O, X, $P_1$, O, $X_1$, $P_2$, $O_1$, $X_2$, $P_1$, $O_2$, X, $P_2$, O, . . .

Figure 19:
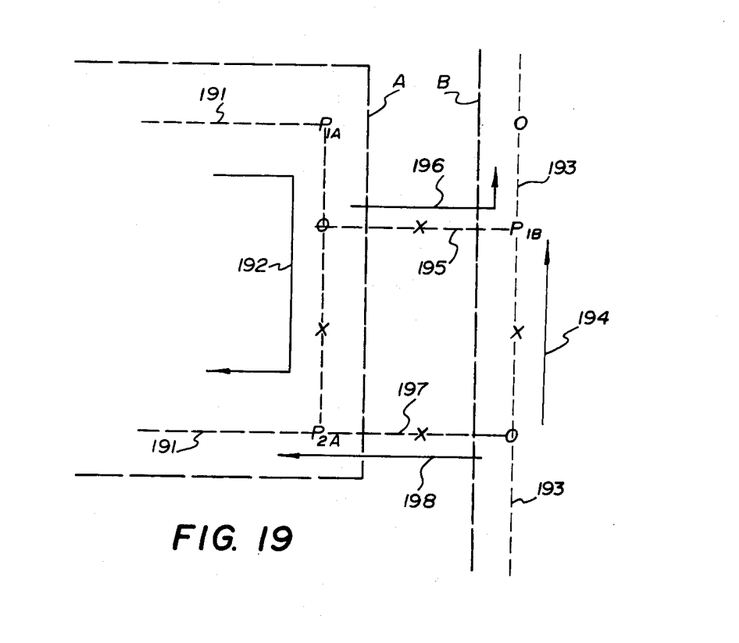
FIG. 19 illustrates the principle of the transfer-gates for the channel-bar propagate circuit.

Another circuit element required for major-minor loop memory organizations is the transfer gate which transfers bubbles between loops. The purpose of the transfer gate is to transfer bubbles of a first circuit A to a second circuit B or vice versa, without affecting the bubble propagation in the independent circuits A and B, if the transfer is not desired. Thus there are four functions to be satisfied: (1) transfer A to B, (2) transfer from B to A, (3) propagation within A, and (4) propagation within B. For channel-bar propagation circuits, the transfer gate may be represented by the pattern shown in FIG. 19. A represents the end or turn-around section of a first loop wherein bubbles may be propagated along a path 191 in the direction shown by arrow 192 under the influence of an alternating transverse magnetic field $H_A$. B represents a second of a propagate circuit in a second loop wherein bubbles may be propagated under the influence of a field $H_B$ along a path 193 in the direction shown by arrow 194. The field $H_B$ is perpendicular to the field $H_A$. This fulfills functions 3 and 4 mentioned above. To fulfill function 1, a channel having a barrier position X is formed between position O in loop A and the discrete pole $P_{1B}$ in loop B. Thus with a bubble at stable position O in loop A, and a field $H_B$, the bubble will propagate A to B along path 195 as shown by arrow 196. To fulfill function 2, a further channel having a barrier position X is formed between position O in loop B and the discrete pole $P_{2A}$ in loop A. Thus with a bubble at stable position O in loop B, and a field $H_A$, the bubble will propagate from B to A along path 197 in the direction shown by arrow 198.

Figure 20:
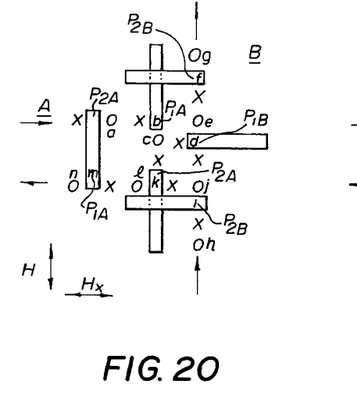
FIGS. 20 to 25 illustrate transfer-gates for parallel path loops.
Figure 21:
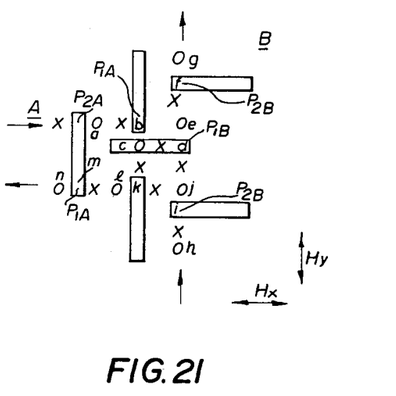
Figure 22:
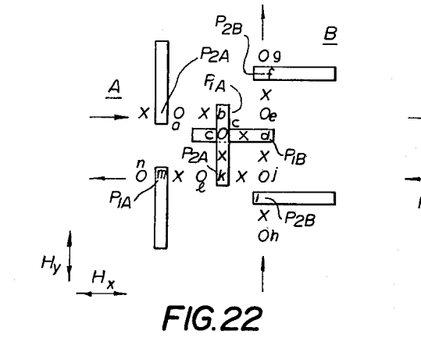
Figure 23:
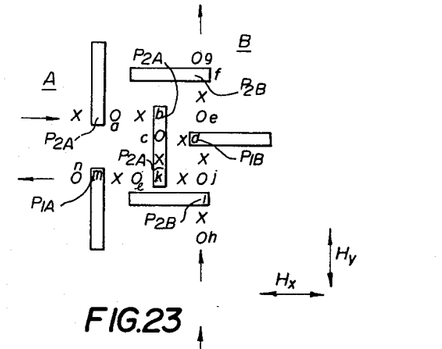
Figure 24:
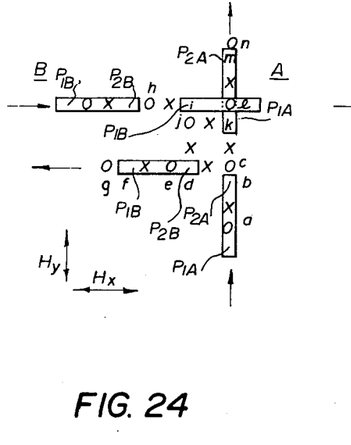
Figure 25:
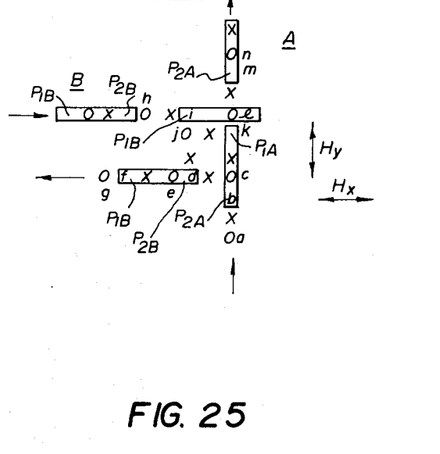

Several embodiments of the transfer gate are shown in FIGS. 20 to 25 where, for simplicity, only the bars, the stable positions O, and the barrier position X are indicated. In FIGS. 20 and 21, loop A includes the turn-around circuit described in FIG. 15 in combination with a section of the channel-bar propagate circuit in loop B to form the transfer gate pattern shown in FIG. 19. In particular, in FIG. 20 loop A is positioned such that two bars in loop B overlap the two end bars in loop A. In FIG. 21, loop A is positioned such that one bar in loop B falls between the two end bars in loop A. In FIGS. 22 and 23, loop A includes the turn-around circuit described in FIG. 16 in combination with a section of the channel-bar propagate circuit in loop B to form the transfer gate pattern shown in FIG. 19. In particular, in FIG. 22, loop A is positioned such that the end bar in loop A overlaps a bar in loop B. In FIG. 23, loop A is positioned such that the end bar in loop A falls between two end bars in loop B. In FIGS. 24 and 25, loop B includes the turn-around circuit described in FIG. 17 in combination with a section of the channel-bar propagate circuit in loop A to form the transfer gate pattern shown in FIG. 19. In particular, in FIG. 24, the end bar in loop B falls between two bars in loop A.

Figure 26:
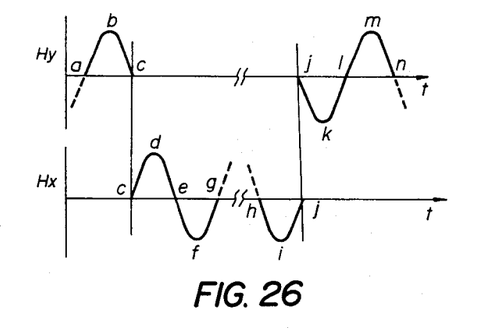
FIG. 26 illustrates the magnetic field waveforms for the control of the transfer gates in FIGS. 20 to 25.

To propagate bubbles in loop A or to transfer a bubble from loop B to loop A, an $H_y$ field is applied to the device in FIGS. 20 to 25. To propagate bubbles in loop B, or to transfer a bubble from loop A to loop B, an $H_x$ field is applied to the devices in FIGS. 20 to 25. The waveforms of the fields $H_x$ and $H_y$ required to perform the four functions are shown in FIG. 26 which includes bubble position letters a, b, c, . . . that correspond with the positions of a bubble in the devices in FIGS. 20 to 25. (1) Assume that a bubble is in the stable position a. A transverse magnetic field $H_y$ propagates the bubble to the position c and $H_y$ is switched off. A transverse field $H_x$ of correct polarity is turned on. The bubble moves from c to d and further propagates in B, that is from d through e, f, g, . . . (2) Assume a bubble position at h. A field $H_x$ propagates the bubble to j and it is switched off. A field $H_y$ is turned on and it moves the bubble from j through k, l, m, n, . . . ; (3) Assume a bubble position at a. If the field $H_x$ is not switched off, the bubble propagates from a through b, c, k, l, m, n, . . . ; (4) Assume a bubble position at h. If the field $H_x$ is on and $H_y = 0$ then the bubble propagates through the following sequence: h, i, j, d, e, f, g, . . . Since the $H_y$ and $H_y$ fields are applied independently, the perpendicular crossings of the bars in FIGS. 20, 22 and 24 do not affect the operation of the transfer gates.

Figure 27:
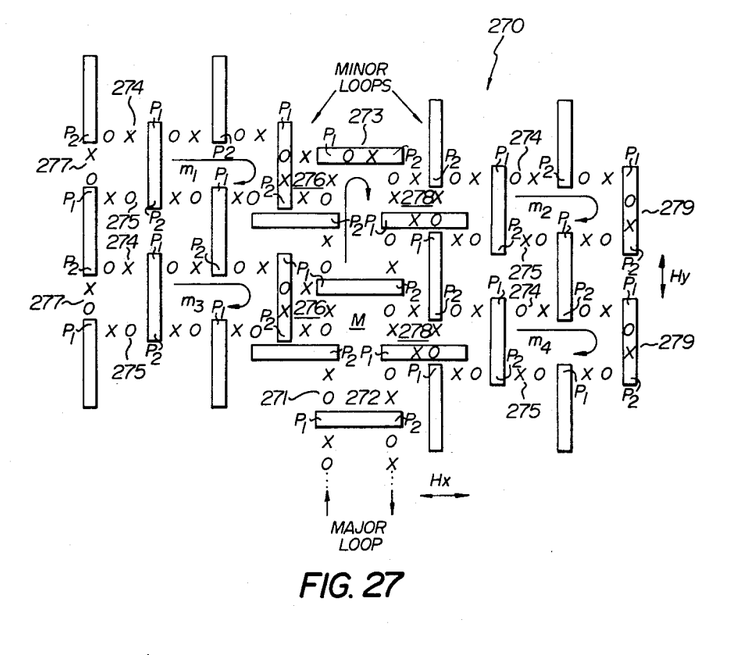
FIG. 27 illustrates one minor-major loop arrangement for memories.

FIG. 27 illustrates one of many possible major-minor loop memory configurations in accordance with the present invention. The system 270 includes one major-loop M and a number of minor loops m. The major loop M includes two parallel propagate circuits 271 and 272 of the type described in FIG. 6 with a turn-around circuit 273 of the type described in FIG. 15 to close the loop. The minor loops m each also includes two parallel propagate circuits 274 and 275 of the type described in FIG. 7. Minor loops m are positioned perpendicular to the major loop M. To couple the odd numbered minor loops $m_1, m_3, \ldots m_{(2k-1)}$ to the major loop M and to complete these loops, the transfer gates 276 of the type shown in FIG. 23 and turn-around circuit 277 of the type shown in FIG. 15 respectively are used. To couple the even numbered minor loops $m_2, m_4, \ldots m_{2k}$ to the major loop M and to complete these loops, transfer gates 278 of the type shown in FIG. 21 and turn-around circuits 279 of the type shown in FIG. 16, respectively are used. The major or assembly loop M is an $H_x$ propagate channel and the minor or storage loops m are $H_y$ propagate channels. The system 270 is very compact since some of the soft magnetic bars are shared between the two channels in a single loop while the other bars are shared between channels in adjacent loops. In addition, the turn-around circuits and the transfer circuits are very compact and provide for simple bubble propagation and transfer.

We claim:

1. A bubble domain propagate circuit for moving bubbles within a bubble supporting material comprising:
   channel means formed in the bubble supporting material, for defining the bubble path, said channel means having periodically spaced stable bubble positions O separated by barrier positions X, and
   magnetic means having a series of well defined poles $P_1$ and $P_2$ located over said channel means between the stable bubble positions O and near the barrier positions X to form a repeated pattern O, X, $P_1$, O, X, $P_2$, said poles $P_1$ and $P_2$ being periodically magnetized to opposite polarities by a first alternating transverse magnetic field to propagate a bubble along the channel means by producing forces on the bubble to move a bubble from a stable position across an adjacent barrier position.

2. A propagate circuit as claimed in claim 1 wherein said magnetic means includes a series of parallel soft-magnetic material bars, positioned substantially perpendicular to said channel means wherein the alternate ends of sequential bars in the series overlap the channel means to form the poles $P_1$ and $P_2$, said poles being magnetized by the alternating transverse magnetic field in the direction of said bars.

3. A propagate circuit as claimed in claim 1 wherein said magnetic means includes a series of soft-magnetic material bars positioned longitudinally over said channel means such that ends of the bars form the poles $P_1$ and $P_2$, said poles being magnetized by the alternating transverse magnetic field in the direction of said bars.

4. A propagate circuit as claimed in claim 1 wherein said channel means consists of a mesa or a groove modulated in thickness on said bubble supporting material to form said stable positions and barrier positions.

5. A propagate circuit as claimed in claim 1 wherein said channel means consists of a mesa or a groove modulated in width said bubble supporting material to form said stable positions and barrier positions.

6. A propagate circuit as claimed in claim 5 wherein the channel means has a modulated width of approximately R and 2R where R is the radius of the bubble domain.

7. A propagate circuit as claimed in claim 1 wherein said channel means consists of a groove modulated in width in said bubble supporting material to form said stable positions and barrier positions.

8. A propagate circuit as claimed in claim 7 wherein said channel means has a minimum width of approximately 5R where R is the bubble radius to form a sequence of stable positions and barrier positions on each side of the channel means to form two bubble paths in the channel means.

9. A propagate circuit as claimed in claim 8 wherein one side of the channel means is terminated by a stable position and the second side of the channel means is terminated by a barrier position, the propagate circuit further including a turn-around circuit having sequence X, $P_2$, O, X, $P_1$, O of barrier, pole and stable positions to form a bubble path coupling the bubble path on the first side of the channel means to the bubble path on the second side of the channel means.

10. A bubble domain propagate circuit for moving bubbles within a bubble supporting material comprising:
    first channel means formed in the bubble supporting material for defining a bubble path,
    second channel means formed parallel to said first channel means in the bubble supporting material for defining a parallel bubble path, each of said channel means having periodically spaced stable bubble positions O separated by barrier positions X:
    first magnetic means having a series of well defined poles $P_1$ and $P_2$ located over each of said channel means between the stable bubble positions O and near the barrier positions X to form a repeated pattern O, X, $P_1$, O, X, $P_2$ in one direction on said first bubble path and in the opposite direction on said second bubble path, the first adjacent end of the first and second paths being terminated by a pole $P_1$ and $P_2$ respectively, $P_1$ and $P_2$ being periodically magnetized to opposite polarities by a directional alternating transverse magnetic field to propagate a bubble along either of said channel means by producing forces on the bubble to move it from a stable position across an adjacent barrier position; and
    third channel means formed in the bubble supporting material at the first adjacent ends of the first and second path for coupling said first channel means and said second channel means, said third channel means having a stable position O and a barrier position X to form the sequence $P_1$, O, X, $P_2$ for moving a bubble from the first channel means to the second means under the control of the alternating magnetic field.

11. A propagate circuit as claimed in claim 10 wherein the second adjacent ends of the first and second paths are terminated by a pole $P_2$ and $P_1$ respectively, and the propagate circuit further includes fourth channel means formed in the bubble supporting material at the second adjacent ends of the first and second paths for coupling said second channel means and said first channel means, said fourth channel means having a stable position O and a barrier position X to form the sequence $P_1$, O, X, $P_2$ for moving a bubble from the second channel means to the first channel means under the control of the oscillating magnetic field.

12. A propagate circuit as claimed in claim 11 which further includes:

fifth channel means formed in the bubble supporting material perpendicular to the first and second channel means and adjacent to the first adjacent ends of the first and second bubble path, said fifth channel means having periodically spaced stable bubble positions O separated by barier positons X;

second magnetic means having a series of well defined poles $P_1$ and $P_2$ located over said fifth channel means between the stable bubble positions O and near the barrier positons X to form a repeated pattern O, X, $P_1$, O, X, $P_2$ in a direction opposite to the sequence $P_1$, O, X, $P_2$ between the first adjacent ends of the first and second bubble paths such that sequential positions O, X, $P_1$, and O of the pattern is adjacent the positions $P_2$, X, O and $P_1$ of the ends of the first and second bubble paths, the poles $P_1$ and $P_2$ in said second magnetic means being periodically magnetized to opposite polarities by a second alternating transverse magnetic field perpendicular to said first magnetic field to propagate a bubble along the fifth channel means by producing forces on the bubble to move it from a stable position across an adjacent barrier position;

sixth channel means formed in the bubble supporting material for coupling said fifth channel to said second channel at adjacent positions O and $P_2$ respectively, said sixth channel having a barrier position X across which a bubble is transferred from the fifth channel to the second channel under the control of the first magnetic field, and seventh channel means formed in the bubble supporting material for coupling said first channel to said fifth channel at adjacent positions O and $P_1$ respectively, said seventh channel means having a barrier position X across which a bubble is transferred from the first channel to the fifth channel under the control of the second magnetic field.

13. A bubble domain transfer circuit for moving bubbles within a bubble supporting material from a first bubble propagating loop to a second propagating loop comprising:

channel means formed in the bubble supporting between the first loop and the second loop, said channel means having a stable bubble position in close proximity to the first loop whereby bubbles propagated in the first loop move through the stable bubble position, and a barrier position between the stable position and the second loop; and magnetic means having well defined pole means located in close proximity to the second loop between the barrier position and the second loop, the pole being magnetized to produce forces on a bubble in the stable position to move the bubble from the stable position across the barrier position into the second loop.

* * * * *